(12) United States Patent
Berge et al.

(10) Patent No.: US 10,024,905 B2
(45) Date of Patent: Jul. 17, 2018

(54) IMPLEMENTING USER CONFIGURABLE PROBING USING MAGNETIC CONNECTIONS AND PCB FEATURES

(71) Applicant: International Business Machines Corporation, Armonk, NY (US)

(72) Inventors: Layne A. Berge, Rochester, MN (US); John R. Dangler, Rochester, MN (US); Matthew S. Doyle, Chatfield, MN (US); Thomas W. Liang, Rochester, MN (US); Manuel Orozco, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 15/287,283

(22) Filed: Oct. 6, 2016

(65) Prior Publication Data

US 2018/0100888 A1   Apr. 12, 2018

(51) Int. Cl.
| | |
|---|---|
| *G01R 31/20* | (2006.01) |
| *G01R 31/28* | (2006.01) |
| *G01R 1/067* | (2006.01) |
| *G01R 1/04* | (2006.01) |

(52) U.S. Cl.
CPC ....... *G01R 31/2808* (2013.01); *G01R 1/0416* (2013.01); *G01R 1/06727* (2013.01); *G01R 1/06794* (2013.01); *G01R 31/2868* (2013.01); *G01R 31/2893* (2013.01); *G01R 31/2896* (2013.01)

(58) Field of Classification Search
CPC .............. G01R 1/0416; G01R 1/06727; G01R 31/2868; G01R 31/2893; G01R 31/2896

USPC ......... 324/71, 378, 403, 415, 425, 500, 537, 324/750.16, 750.24
See application file for complete search history.

(56) References Cited

U.S. PATENT DOCUMENTS

| | | |
|---|---|---|
| 8,187,006 B2 | 3/2012 | Rudisill et al. |
| 2003/0043554 A1 | 3/2003 | Seymour |
| 2005/0280429 A1* | 12/2005 | Maxwell ................ G01R 1/067 324/754.17 |
| 2007/0072443 A1 | 3/2007 | Rohrbach et al. |
| 2010/0048038 A1 | 2/2010 | Han et al. |
| 2013/0273752 A1 | 10/2013 | Rudisill et al. |
| 2015/0111399 A1 | 4/2015 | Karls et al. |
| 2015/0236444 A1 | 8/2015 | Bdeir |

(Continued)

FOREIGN PATENT DOCUMENTS

WO    WO2008051450 A3    5/2008

OTHER PUBLICATIONS

Magnetische Steckverbinder von N&H Technology GmbH, "Magnetic Connector", 2016.

(Continued)

*Primary Examiner* — Jermele M Hollington
*Assistant Examiner* — Raul Rios Russo
(74) *Attorney, Agent, or Firm* — Joan Pennington

(57) ABSTRACT

A method and system are provided for implementing user configurable probing with magnetic connections and printed circuit board (PCB) features. A first magnet is located at a desired probe point on the PCB, a probe having a second magnet of suitable polarity and an electrical contact is moved to the probe point. The first and second magnets attract each other, and the probe point makes electrical contact with an electrical conductor at the probe point.

11 Claims, 5 Drawing Sheets

(56) References Cited

U.S. PATENT DOCUMENTS

2016/0344136 A1* 11/2016 Bdeir ................... H01R 11/30
2017/0196086 A1* 7/2017 Bdeir ................... H05K 1/14

OTHER PUBLICATIONS

Ara Nerses Knaian, "Electropermanent Magnetic Connectors and Actuators—Devices and their Applications in Programmable Matter", Massachusetts Institute of Technology, Jun. 2010.
N2848A InfiniiMax III QuickTip Probe Head, 2016 http://www.keysight.com/en/pd-2404629-pn-N2848A/infiniimax-iii-quicktip-probe-head?nid=-34385.1088003&cc=US&lc=eng.

* cited by examiner

IMPLEMENTING USER CONFIGURABLE PROBING USING MAGNETIC CONNECTIONS AND PCB FEATURES

FIELD OF THE INVENTION

The present invention relates generally to the data processing field, and more particularly, relates to method and system for implementing user configurable probing with magnetic connections and printed circuit board (PCB) features.

DESCRIPTION OF THE RELATED ART

Various probing arrangements are known in the art. Some known probing arrangements require soldering leads to printed circuit boards (PCBs), and many probing arrangements provide limited probing flexibility for the PCBs.

A need exists for an efficient and effective method and system for implementing probing of multiple locations on a PCB without soldering and potentially damaging the PCB.

SUMMARY OF THE INVENTION

Principal aspects of the present invention are to provide a method and system for implementing user configurable probing with magnetic connections and printed circuit board (PCB) features. Other important aspects of the present invention are to provide such method and system substantially without negative effects and that overcome many of the disadvantages of prior art arrangements.

In brief, a method and system are provided for implementing user configurable probing with magnetic connections and printed circuit board (PCB) features. A first magnet is located at a desired probe point on the PCB, a probe having a second magnet of suitable polarity and an electrical contact is moved to the probe point. The first and second magnets attract each other, and the probe makes electrical contact with an electrical conductor at the probe point.

In accordance with features of the invention, the first and second magnets are peel and stick magnets.

In accordance with features of the invention, the second magnet circumscribes a magnetic solder mask on the PCB defining the first magnet.

In accordance with features of the invention, the probe point includes a magnetic solder mask within a via on the PCB.

In accordance with features of the invention, the probe includes a differential pair via with the differential pair via including a North magnetic material and a South magnetic material respectively contacting a South magnetic material and a North magnetic material on the PCB.

In accordance with features of the invention, the probe includes a respective differential pair via including a respective North magnetic material and a respective South magnetic material, each contacting a respective PCB via, each respective PCB via including a selectable polarized ferromagnetic material.

In accordance with features of the invention, the probe includes a selectable electromagnetic material at a probe tip.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention. In particular, references to "file" should be broadly considered to include and may be substituted with block, page or any other logical subdivision of data, The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and system are provided for implementing user configurable probing with magnetic connections and printed circuit board (PCB) features. A first magnet is located at a desired probe point on the PCB, a probe having a second magnet of suitable polarity and an electrical contact is moved to the probe point. The first and second magnets attract each other, and the probe makes electrical contact with an electrical conductor at the probe point.

In accordance with features of the invention, the first and second magnets are peel and stick magnets implementing user configurable probing system, enabling probing of multiple locations on a PCB without soldering and potentially damaging the PCB.

Figure 1A:
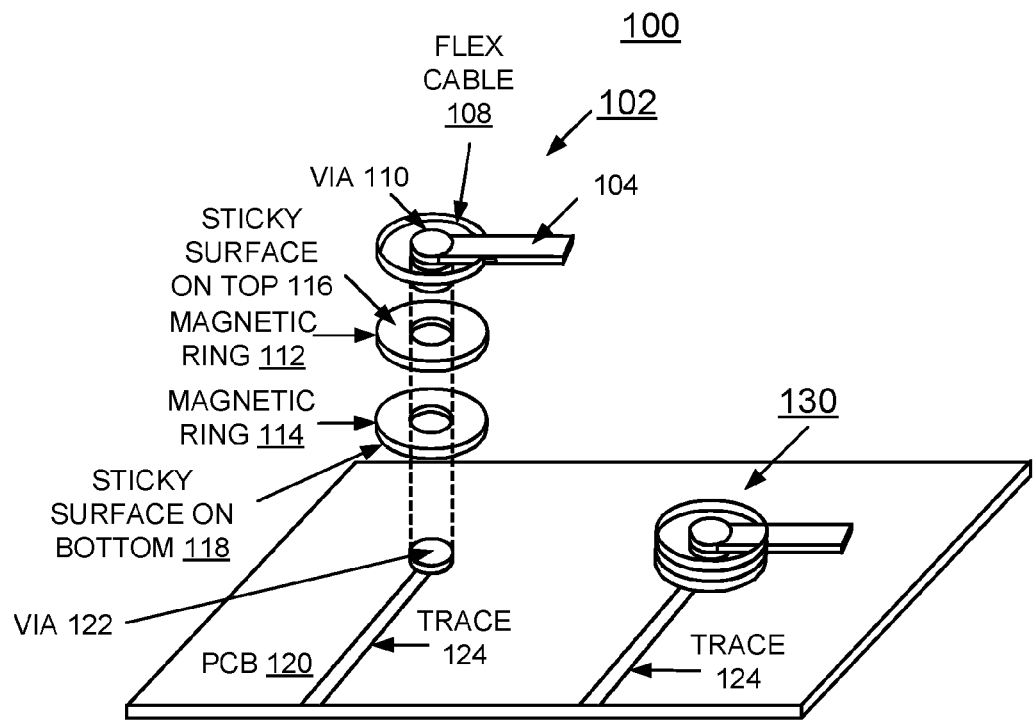
FIGS. 1A and 1B illustrate an example user configurable probing system with magnetic connections and a printed circuit board (PCB) features in accordance with a preferred embodiment.
Figure 1B:
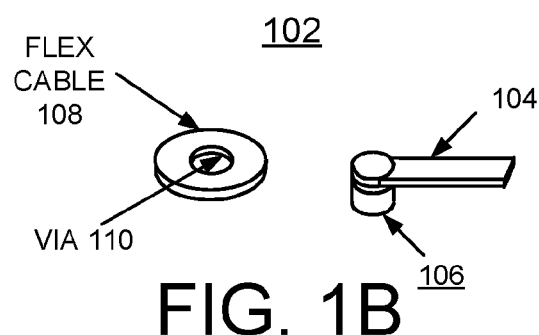

Having reference now to the drawings, in FIGS. 1A and 1B there is shown an example user configurable probing system generally designated by the reference character 100 with magnetic connections and printed circuit board (PCB) features using peel and stick magnets in accordance with a preferred embodiment. User configurable probing system 100 includes an example magnetic probe assembly generally designated by the reference character 102. Magnetic probe 102 includes a flex trace 104 with a plated via 106 best seen in FIG. 1B, a flex cable 108 includes a via 110 receiving the plated via 106. User configurable probing system 100 includes a first magnetic ring 112 and a second magnetic ring 114. The plated via 106, for example, has a plating thickness at the flex via 110 two times the thickness of the magnetic ring 112. The first magnetic ring 112 has a sticky upper or top surface 116 and the second magnetic ring 114 has a sticky lower or bottom surface 118. The first magnetic ring 112 and the second magnetic ring 114 include a plated copper thickness, for example, equal to two times (2×) the thickness of the magnetic ring. The first magnetic ring 112 and the second magnetic ring 114 can be implemented with commercially available peel and stick magnets. A printed circuit board (PCB) 120 includes a via 122 coupled to an electrical PCB trace 124. The sticky lower or bottom surface 118 of the magnetic ring 114 engage the PCB 120 and electrical PCB trace 124 having an opening surrounding PCB via 122 and positioning the magnetic ring 114. Assembled user configurable probe 130 of the user configurable probing system 100 is shown assembled with the PCB 120.

In accordance with features of the invention, the user configurable probing system includes circumscribing magnetic solder mask, also enabling probing of multiple locations on a PCB without soldering and potentially damaging the PCB.

Figures 2A, 2B:
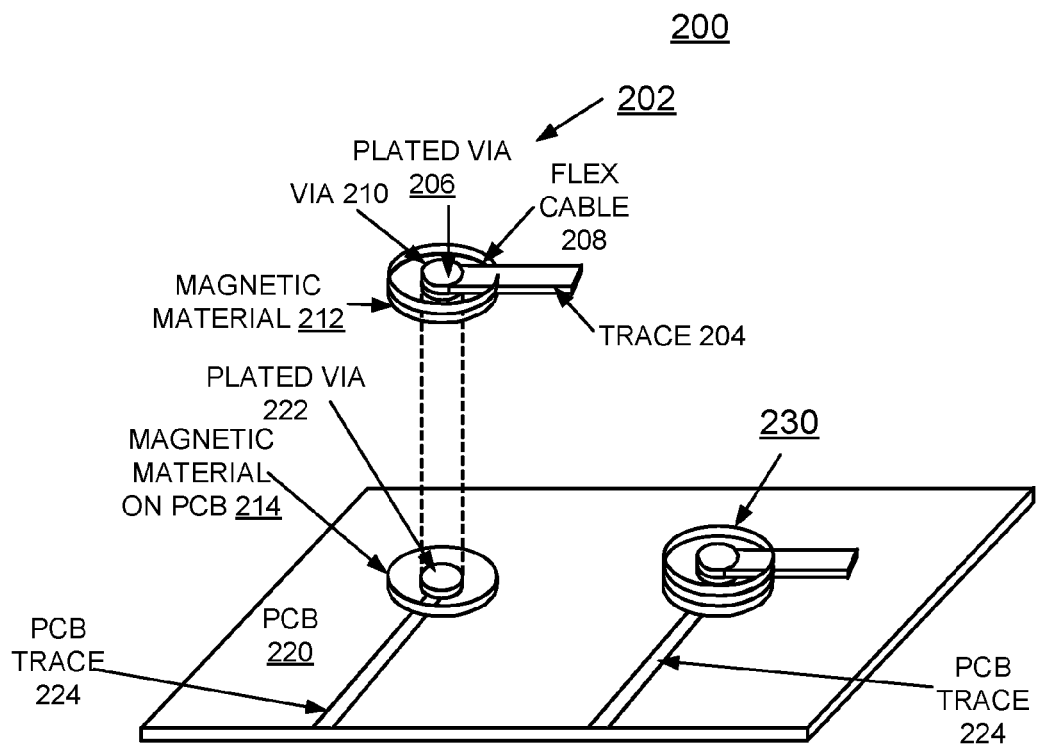
FIGS. 2A and 2B illustrate another example user configurable probing system with magnetic connections and a printed circuit board (PCB) features in accordance with a preferred embodiment.

Referring to FIGS. 2A and 2B, there is shown another example user configurable probing system generally designated by the reference character 200 with magnetic connections and printed circuit board (PCB) features using circumscribing magnetic solder mask in accordance with a preferred embodiment. User configurable probing system 200 includes an example magnetic probe assembly generally designated by the reference character 202. Magnetic probe 202 includes a probe trace 204 with a probe plated via 206 best seen in FIG. 2B, a flex cable 208 includes a via 210 receiving the probe plated via 206. User configurable probing system 200 includes a first magnetic material 212 and a second magnetic material 214 on the PCB. The plated via 206 extends through the first magnetic material 212. A printed circuit board (PCB) 220 includes a plated PCB via 222 coupled to an electrical PCB trace 224. The second magnetic material 214 engages the PCB 220 and electrical PCB trace 224 having an opening surrounding and electrically engaging the PCB plated via 222 and positioning the second magnetic material 214. Assembled user configurable probe 230 of the user configurable probing system 200 is shown assembled with the PCB 220.

In accordance with features of the invention, the user configurable probing system uses magnetic solder mask within a via (non-polarized probing), also enabling probing of multiple locations on a PCB without soldering and potentially damaging the PCB.

Figure 3A:
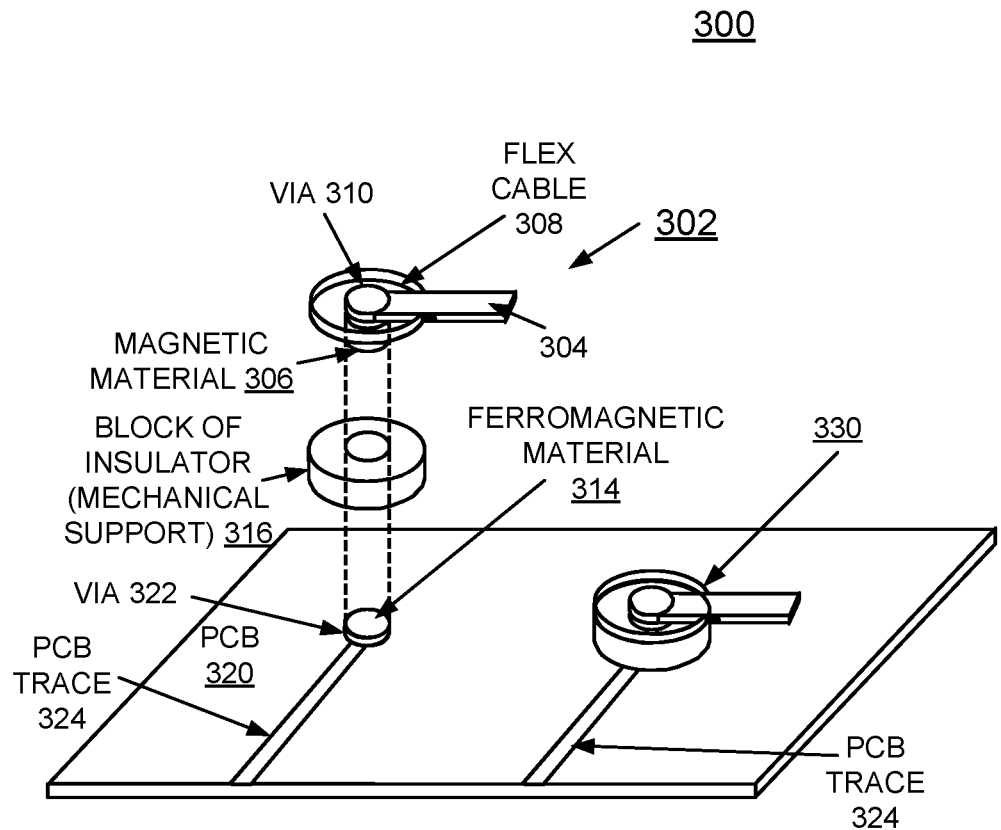
FIGS. 3A and 3B illustrate another example user configurable probing system with magnetic connections and a printed circuit board (PCB) features in accordance with a preferred embodiment.
Figure 3B:
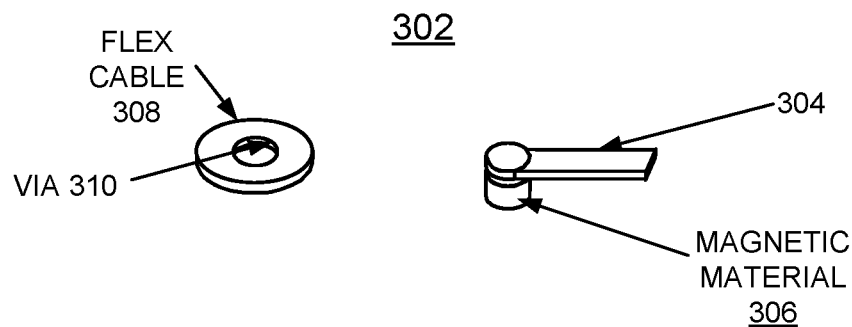

Referring to FIGS. 3A and 3B, there is shown another example user configurable probing system generally designated by the reference character 300 with magnetic connections and printed circuit board (PCB) features using magnetic solder mask within a via (non-polarized probing) in accordance with a preferred embodiment. User configurable probing system 300 includes an example magnetic probe assembly generally designated by the reference character 302. Magnetic probe 302 includes a probe trace 304 with a magnetic material 306 best seen in FIG. 3B, a flex cable 308 includes a probe flex via 310 receiving the magnetic material 306. User configurable probing system 300 includes a ferromagnetic material 314 received in a PCB via 322. The magnetic material 306 extends through the probe flex via 310. A block of insulator 316 provides mechanical support for the magnetic material 306. A printed circuit board (PCB) 320 includes the plated PCB via 222 coupled to an electrical PCB trace 324. Assembled user configurable probe 330 of the user configurable probing system 300 is shown assembled with the PCB 320.

In accordance with features of the invention, the user configurable probing system uses circumscribing magnetic solder mask within a via (polarized probing), also enabling probing of multiple locations on a PCB without soldering and potentially damaging the PCB.

Figure 4:
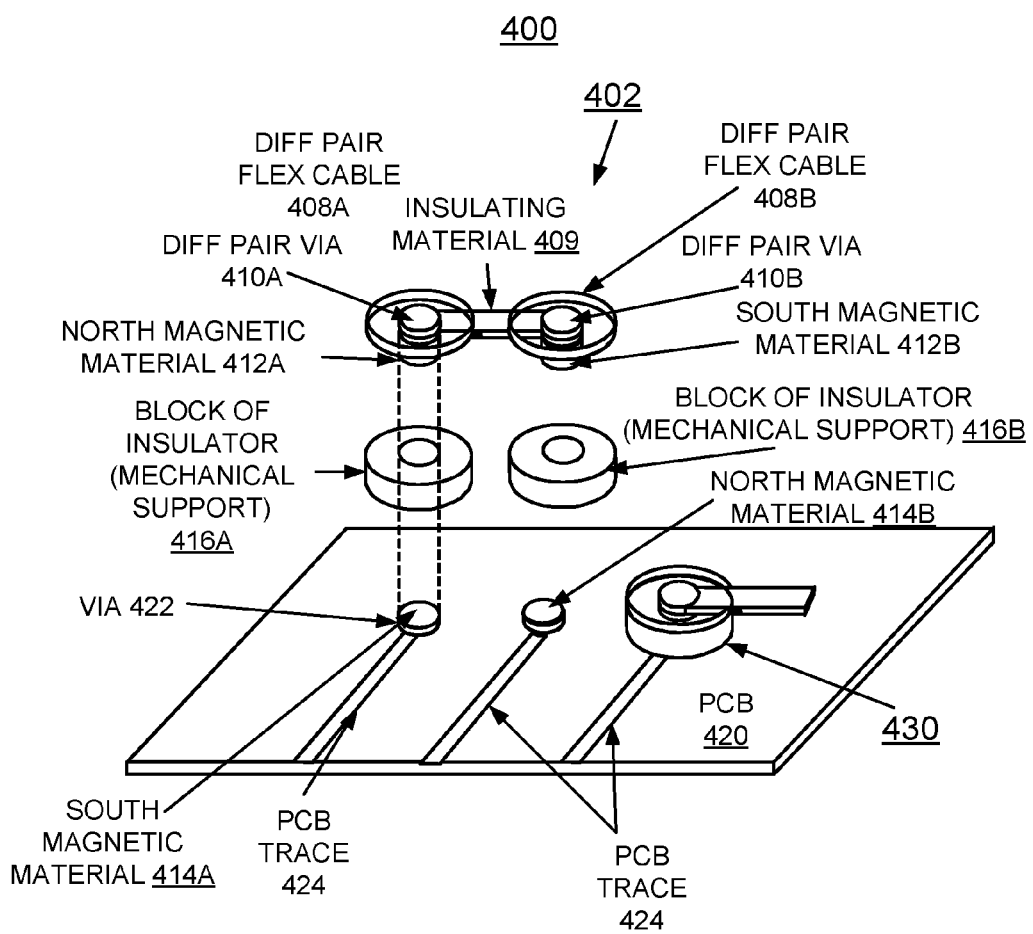
FIG. 4 illustrates another example user configurable probing system with magnetic connections and a printed circuit board (PCB) features in accordance with a preferred embodiment.

Referring to FIG. 4, there is shown another example user configurable probing system generally designated by the reference character 400 with magnetic connections and a printed circuit board (PCB) features using magnetic solder mask within a via (polarized probing) in accordance with a preferred embodiment. User configurable probing system 400 includes an example differential pair magnetic probe assembly generally designated by the reference character 402. Differential pair magnetic probe 402 includes with a differential pair flex cable 408A, 208B coupled by an insulating material 409 including a respective differential pair probe flex via 410A, 410B receiving a respective North magnetic material 412A, and a South magnetic material 412B. User configurable probing system 400 includes a respective South magnetic material 414A, and a North magnetic material 414B, each received in a respective associated PCB via 422. The respective North magnetic material 412A, and South magnetic material 412B extends through the respective associated differential pair probe flex via 410A, 410B. A respective block of insulator 416A, 416B provides mechanical support for the respective North magnetic material 412A, and South magnetic material 412B. A printed circuit board (PCB) 420 includes the PCB via 422 coupled to an electrical PCB trace 424. An example one side of the assembled differential pair user configurable probe 430 of the user configurable probing system 400 is shown assembled with the PCB 420.

In accordance with features of the invention, the user configurable probing system uses circumscribing magnetic solder mask within a via (polarized probing using polarized ferromagnetic PCB vias), also enabling probing of multiple locations on a PCB without soldering and potentially damaging the PCB.

Figure 5:
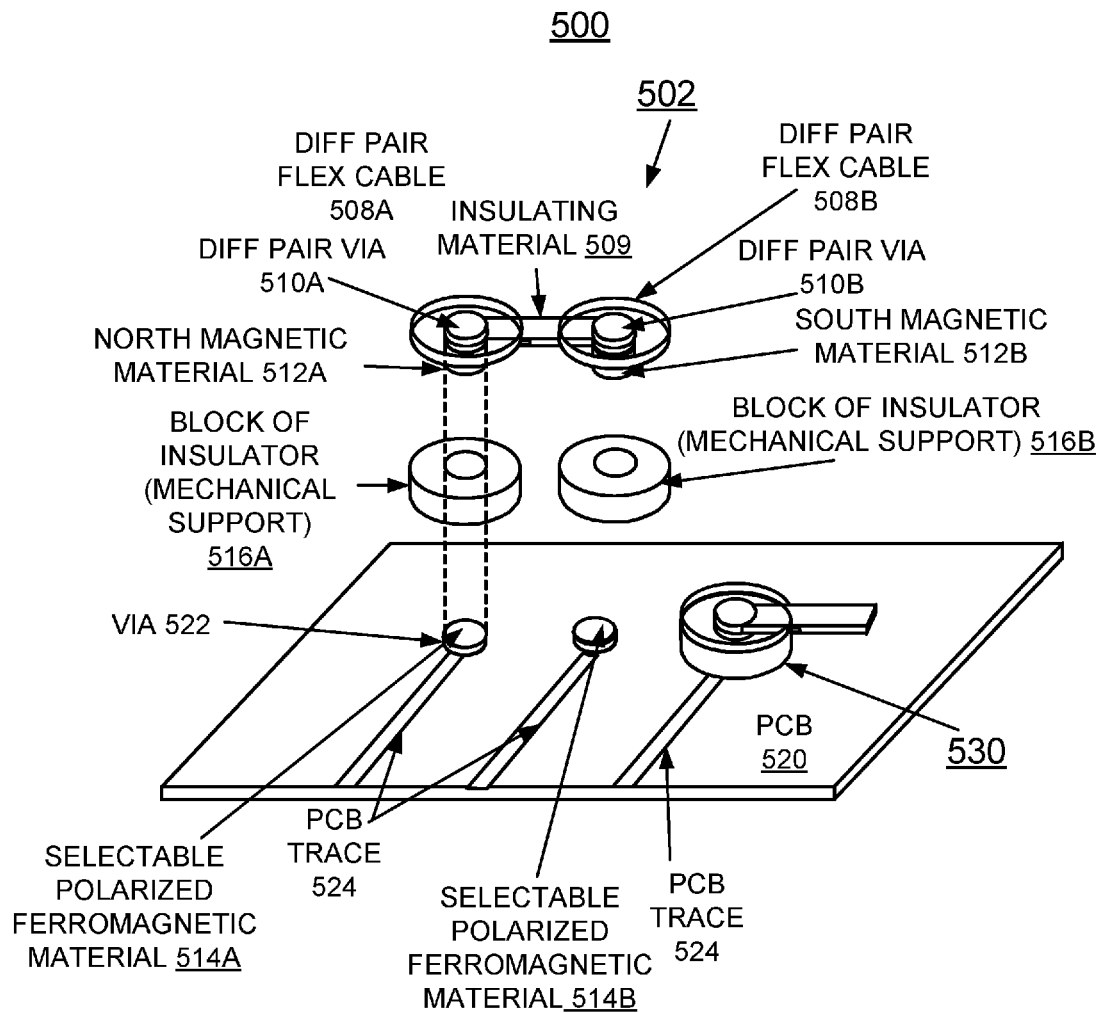
FIG. 5 illustrates another example user configurable probing system with magnetic connections and a printed circuit board (PCB) features in accordance with a preferred embodiment.

Referring to FIG. 5, there is shown another example user configurable probing system generally designated by the reference character 500 with magnetic connections and a printed circuit board (PCB) uses circumscribing magnetic solder mask within a via (polarized probing using polarized ferromagnetic PCB vias) in accordance with a preferred embodiment. User configurable probing system 500 includes an example differential pair magnetic probe assembly generally designated by the reference character 502. Differential pair magnetic probe 502 includes with a differential pair flex cable 508A, 508B coupled by an insulating material 509 including a respective differential pair probe flex via 510A, 510B receiving a respective North magnetic material 512A, and a South magnetic material 512B. User configurable probing system 500 includes a respective selectable polarized ferromagnetic material 514A, and a selectable polarized ferromagnetic material 514B, each received in a respective associated PCB via 522. The respective North magnetic material 512A, and South magnetic material 512B extends through the respective associated differential pair probe flex via 510A, 510B. A respective block of insulator 516A, 516B provides mechanical support for the respective North magnetic material 512A, and South magnetic material 512B. A printed circuit board (PCB) 520 includes the respective PCB via 522 coupled to an electrical PCB trace 524. An example one side of the assembled differential pair user configurable probe 530 of the user configurable probing system 500 is shown assembled with the PCB 520.

While the present invention has been described with reference to the details of the embodiments of the invention shown in the drawing, these details are not intended to limit the scope of the invention as claimed in the appended claims.

What is claimed is:

1. A method for implementing user configurable probing with magnetic connections and printed circuit board (PCB) features comprising:
   providing a first magnet at a desired probe point on the PCB;
   providing a probe having a second magnet of suitable polarity and an electrical contact; and
   moving said probe to said probe point, said first and second magnets attracting each other, and said probe making electrical contact with an electrical conductor at the probe point on the PCB.

2. The method as recited in claim 1, includes providing said first and second magnets including said second magnet circumscribing a magnetic solder mask on the PCB defining said first magnet.

3. The method as recited in claim 1, includes providing said probe including a selectable electromagnet at a probe tip.

4. The method as recited in claim 1 includes providing said probe including a flex cable with a flex via, a probe tip of said probe extending through said flex via.

5. The method as recited in claim 1, wherein locating said first magnet at said desired probe point on the PCB includes using at least one polarized ferromagnetic material in a PCB via.

6. A system for implementing user configurable probing with magnetic connections and printed circuit board (PCB) features comprising:
   a first magnet provided at a desired probe point on the PCB;
   a probe having a second magnet of suitable polarity and an electrical contact to said probe point; and
   said first and second magnets attracting each other, and said probe making electrical contact with an electrical conductor at the probe point on the PCB.

7. The system as recited in claim 6, wherein said first and second magnets include said second magnet circumscribing a magnetic solder mask on the PCB defining said first magnet.

8. The system as recited in claim 6, wherein said probe includes a selectable electromagnetic material at a probe tip.

9. The system as recited in claim 6, wherein said probe includes a flex cable with a flex via, and a probe tip of said probe extending through said flex via.

10. The system as recited in claim 6, wherein said first magnet at said desired probe point on the PCB includes at least one polarized ferromagnetic material within a PCB via.

11. The system as recited in claim 6, wherein said first magnet and said second magnet enable probing multiple locations on a PCB without soldering and without damaging the PCB.

\* \* \* \* \*